United States Patent
Basu et al.

(10) Patent No.: US 8,946,009 B2
(45) Date of Patent: Feb. 3, 2015

(54) LOW EXTENSION RESISTANCE III-V COMPOUND FIN FIELD EFFECT TRANSISTOR

(71) Applicant: International Business Machines Corporation, Armonk, NY (US)

(72) Inventors: Anirban Basu, Elmsford, NY (US); Pouya Hashemi, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/021,336

(22) Filed: Sep. 9, 2013

(65) Prior Publication Data

US 2014/0335665 A1 Nov. 13, 2014

Related U.S. Application Data

(63) Continuation of application No. 13/889,718, filed on May 8, 2013.

(51) Int. Cl.
*H01L 21/00* (2006.01)
*H01L 21/336* (2006.01)
*H01L 21/20* (2006.01)
*H01L 29/66* (2006.01)

(52) U.S. Cl.
CPC .... *H01L 29/66818* (2013.01); *H01L 29/66522* (2013.01); *H01L 29/6653* (2013.01)
USPC ............ 438/151; 438/157; 438/197; 438/479

(58) Field of Classification Search
None
See application file for complete search history.

(56) References Cited

U.S. PATENT DOCUMENTS

| | | | |
|---|---|---|---|
| 7,087,471 B2 | 8/2006 | Beintner | |
| 7,300,837 B2 | 11/2007 | Chen et al. | |
| 7,309,626 B2 | 12/2007 | Ieong et al. | |
| 7,625,790 B2 | 12/2009 | Yang | |
| 7,893,492 B2 | 2/2011 | Bedell et al. | |
| 8,236,634 B1 | 8/2012 | Kanike et al. | |
| 2002/0036290 A1 | 3/2002 | Inaba et al. | |
| 2007/0026615 A1 | 2/2007 | Goktepeli et al. | |
| 2007/0152266 A1 | 7/2007 | Doyle et al. | |
| 2007/0272925 A1 | 11/2007 | Choi et al. | |

(Continued)

OTHER PUBLICATIONS

Office Action dated May 29, 2014 received in a related U.S. Patent Applicaion , namely U.S. Appl. No. 13/889,718.

(Continued)

*Primary Examiner* — Scott B Geyer
(74) *Attorney, Agent, or Firm* — Scully, Scott, Murphy & Presser, P.C.; Louis J. Percello, Esq.

(57) ABSTRACT

A gate stack including a gate dielectric and a gate electrode is formed over at least one compound semiconductor fin provided on an insulating substrate. The at least one compound semiconductor fin is thinned employing the gate stack as an etch mask. Source/drain extension regions are epitaxially deposited on physically exposed surfaces of the at least one semiconductor fin. A gate spacer is formed around the gate stack. A raised source region and a raised drain region are epitaxially formed on the source/drain extension regions. The source/drain extension regions are self-aligned to sidewalls of the gate stack, and thus ensure a sufficient overlap with the gate electrode. Further, the combination of the source/drain extension regions and the raised source/drain regions provides a low-resistance path to the channel of the field effect transistor.

8 Claims, 15 Drawing Sheets

(56) References Cited

U.S. PATENT DOCUMENTS

| | | |
|---|---|---|
| 2008/0233699 A1 | 9/2008 | Booth et al. |
| 2009/0149012 A1 | 6/2009 | Brask et al. |
| 2011/0053361 A1 | 3/2011 | Muralidhar et al. |
| 2011/0147846 A1 | 6/2011 | Su et al. |
| 2011/0284967 A1 | 11/2011 | Cheng et al. |
| 2012/0276721 A1 | 11/2012 | Chung et al. |
| 2012/0280250 A1 | 11/2012 | Basker et al. |
| 2013/0049115 A1 | 2/2013 | Cheng et al. |
| 2013/0228872 A1 | 9/2013 | Bajaj et al. |
| 2013/0307076 A1 | 11/2013 | Cheng et al. |
| 2014/0061734 A1 | 3/2014 | Basker et al. |
| 2014/0061793 A1 | 3/2014 | Pei et al. |
| 2014/0070316 A1 | 3/2014 | Chan et al. |
| 2014/0097518 A1 | 4/2014 | Cheng et al. |

OTHER PUBLICATIONS

Notice of Allowance dated Aug. 7, 2014 received in the parent U.S. Patent Application, namely U.S. Appl. No. 13/889,718.

Anonymous, IP.COM publication, IPCOM000224212D, entitled "Epitaxial Re-growth in the Source/Drain Region for Improved Performance of III-V FinFET/Trigate Devices", published on Dec. 13, 2012, pp. 6.

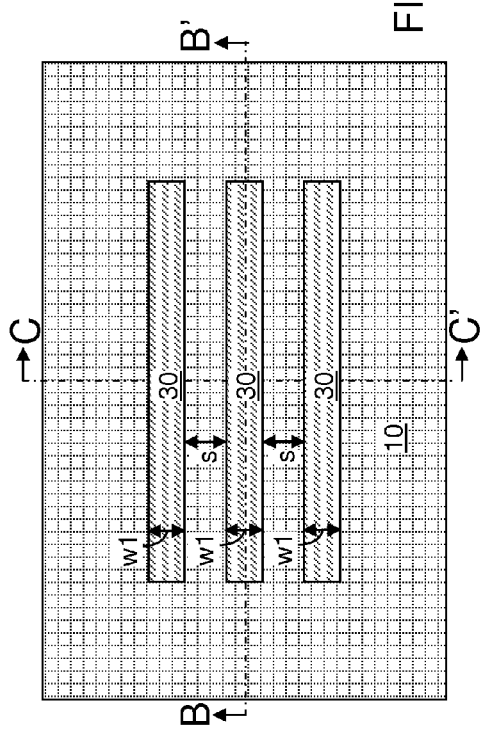
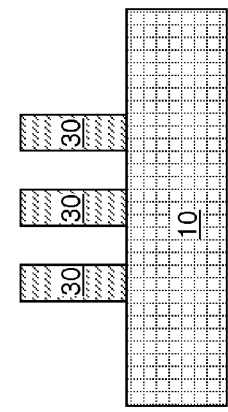
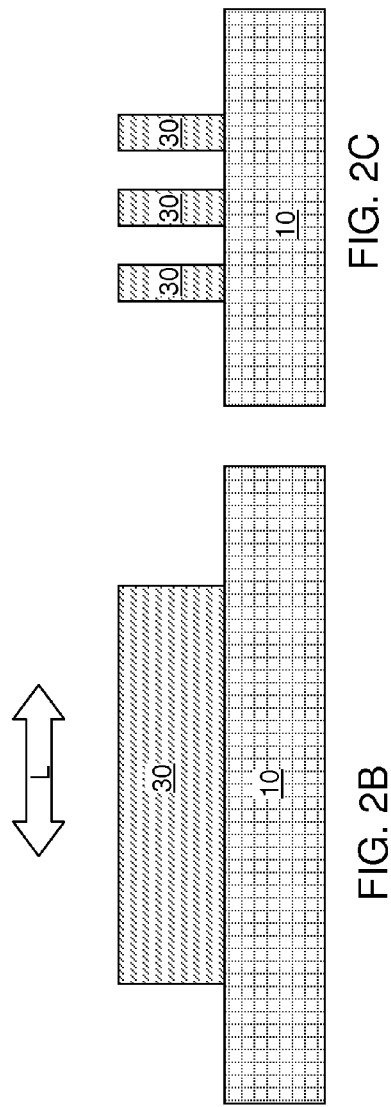
FIG. 2A
FIG. 2B
FIG. 2C

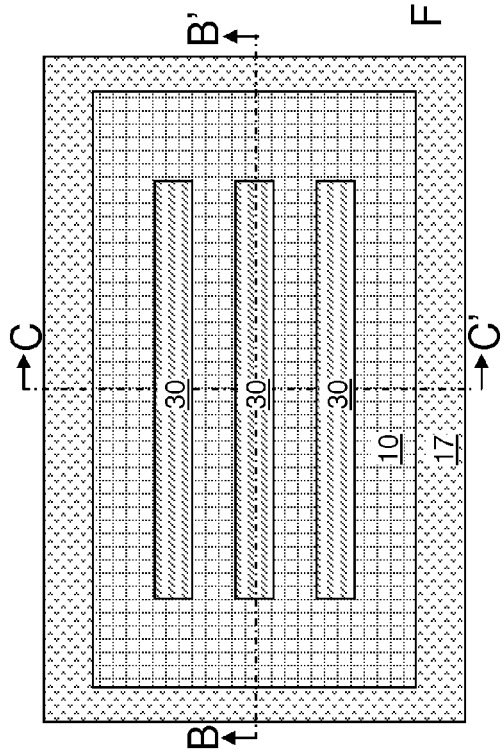
FIG. 3A
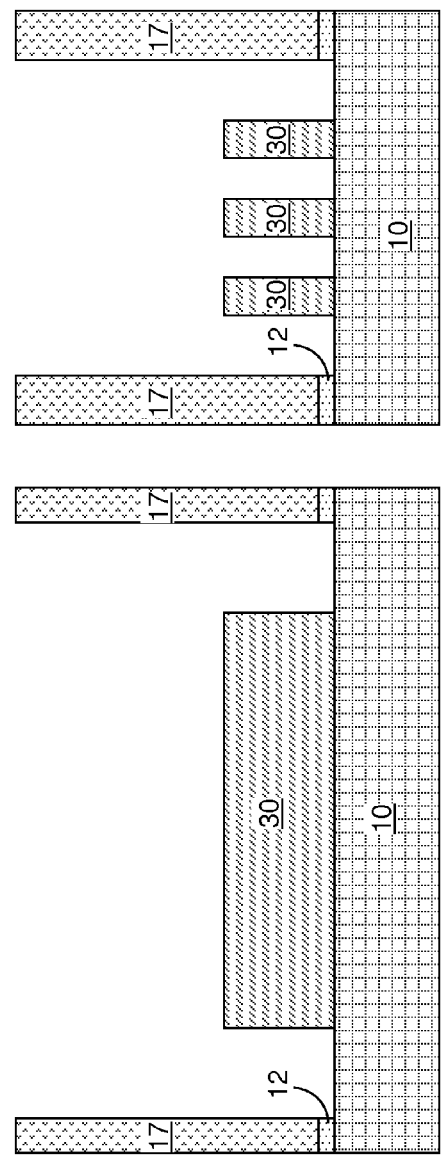
FIG. 3B
FIG. 3C

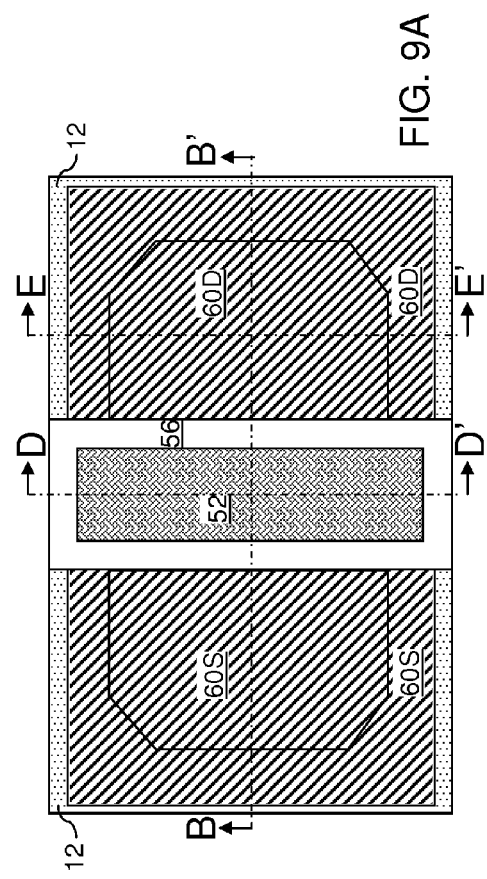
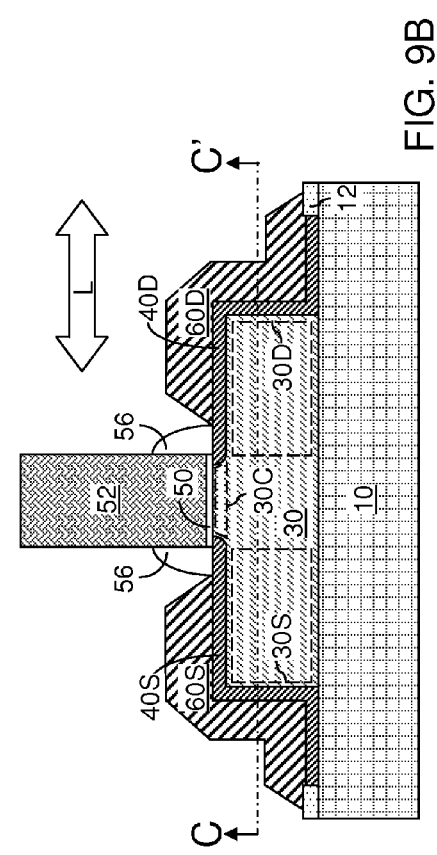

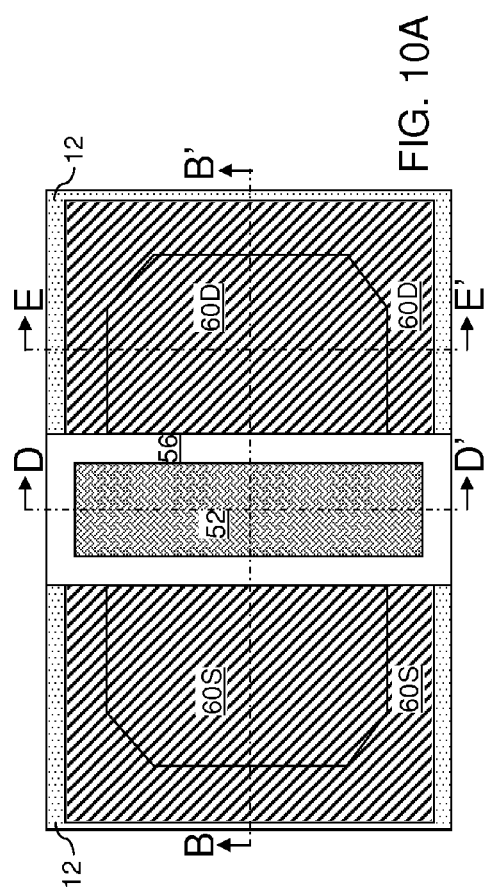
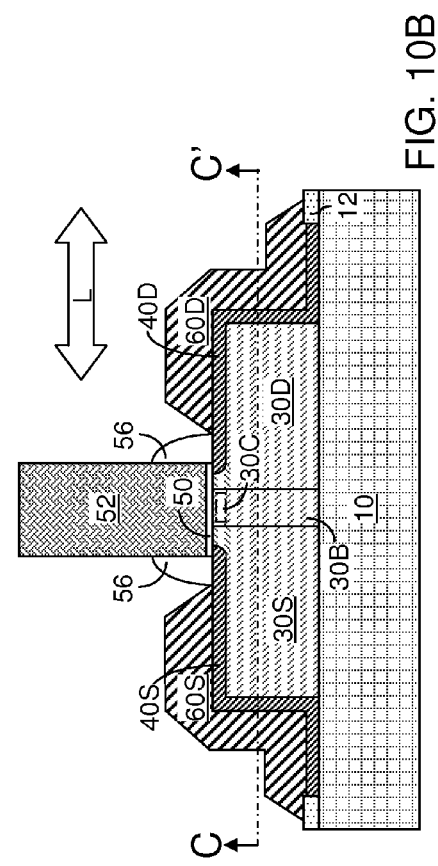

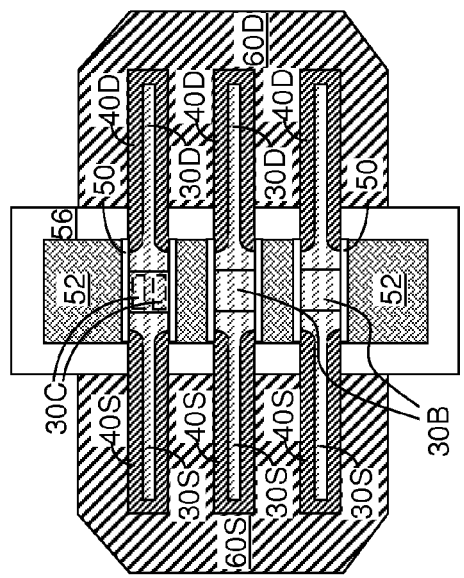
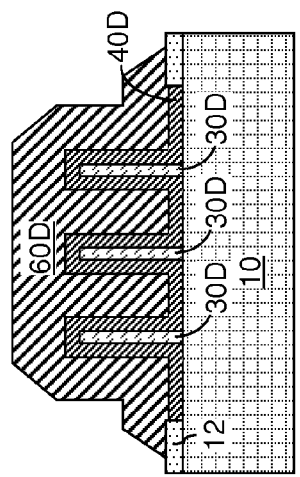
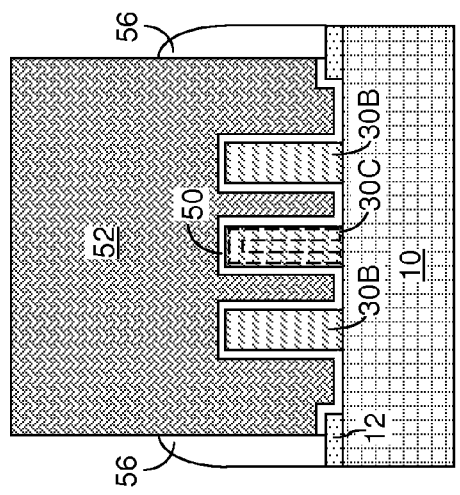
FIG. 10C
FIG. 10D
FIG. 10E

LOW EXTENSION RESISTANCE III-V COMPOUND FIN FIELD EFFECT TRANSISTOR

RELATED APPLICATIONS

This application is a continuation of U.S. patent application Ser. No. 13/889,718, filed May 8, 2013, the entire content and disclosure of which is incorporated herein by reference.

BACKGROUND

The present disclosure relates to a semiconductor structure, and particularly to a compound fin field effect transistor (finFET) including self-aligned epitaxial source/drain extension regions and a method of manufacturing the same.

Ion implantation is typically employed to form source/drain extension regions in a finFET. However, the presence of a gate spacer in a finFET makes it difficult to form source/drain extension regions with sufficient overlap with an overlying gate electrode through ion implantation. Insufficient overlay between source/drain extension regions and a gate electrode in a III-V compound finFET can reduce performance of the III-V compound finFET.

SUMMARY

A gate stack including a gate dielectric and a gate electrode is formed over at least one compound semiconductor fin provided on an insulating substrate. The at least one compound semiconductor fin is thinned employing the gate stack as an etch mask. Source/drain extension regions are epitaxially deposited on physically exposed surfaces of the at least one semiconductor fin. A gate spacer is formed around the gate stack. A raised source region and a raised drain region are epitaxially formed on the source/drain extension regions. The source/drain extension regions are self-aligned to sidewalls of the gate stack, and thus ensure a sufficient overlap with the gate electrode. Further, the combination of the source/drain extension regions and the raised source/drain regions provides a low-resistance path to the channel of the field effect transistor.

According to an aspect of the present disclosure, a semiconductor structure is provided. The semiconductor structure includes a semiconductor fin and a gate stack. The semiconductor fin is located on a top surface of an insulator substrate, includes a single crystalline compound semiconductor material, and laterally extends along a lengthwise direction. The semiconductor fin includes a channel region, a source-side fin portion, and a drain-side fin portion. The channel region has a first pair of sidewalls separated by a first width. The source-side fin portion includes a second pair of sidewalls separated by a second width that is less than the first width. The drain-side fin portion includes a third pair of sidewalls separated by the second width and laterally spaced from the source-side fin portion by the channel region. The gate stack includes a gate dielectric and a gate electrode and straddling the channel region.

According to another aspect of the present disclosure, a method of forming a semiconductor structure is provided. A semiconductor fin is formed on a top surface of an insulator substrate. The semiconductor fin includes a single crystalline compound semiconductor material and has a first width throughout. A gate stack is formed over the semiconductor fin. The gate stack includes a gate dielectric and a gate electrode. Physically exposed surfaces of the semiconductor fin are recessed employing the gate stack as an etch mask. A source-side fin portion and a drain-side fin portion that have a second width are formed. A source-extension region and a drain-extension region are simultaneously formed on the source-side fin portion and on the drain-side fin portion, respectively, by selective epitaxy of a doped compound semiconductor material.

BRIEF DESCRIPTION OF SEVERAL VIEWS OF THE DRAWINGS

FIG. 2A is a top-down view of the exemplary semiconductor structure after formation of semiconductor fins and removal of the photoresist layer according to an embodiment of the present disclosure.

FIG. 2B is a vertical cross-sectional view of the exemplary semiconductor structure along the vertical plane B-B' in FIG. 2A.

FIG. 2C is a vertical cross-sectional view of the exemplary semiconductor structure along the vertical plane C-C' in FIG. 2A.

FIG. 3A is a top-down view of the exemplary semiconductor structure after application and deposition and patterning of an amorphous dielectric material layer according to an embodiment of the present disclosure.

FIG. 3B is a vertical cross-sectional view of the exemplary semiconductor structure along the vertical plane B-B' in FIG. 3A.

FIG. 3C is a vertical cross-sectional view of the exemplary semiconductor structure along the vertical plane C-C' in FIG. 3A.

FIG. 9A is a top-down view of the exemplary semiconductor structure after formation of a raised source region and a raised drain region by a second selective epitaxy process according to an embodiment of the present disclosure.

FIG. 9B is a vertical cross-sectional view of the exemplary semiconductor structure along the vertical plane B-B' in FIG. 9A.

FIG. 10A is a top-down view of a variation of the exemplary semiconductor structure after performing an anneal that diffuses dopants from the source-extension region and the drain-extension region into a source-side fin portion and a drain-side fin portion according to an embodiment of the present disclosure.

FIG. 10B is a vertical cross-sectional view of the exemplary semiconductor structure along the vertical plane B-B' in FIG. 10A.

FIG. 10C is a horizontal cross-sectional view of the exemplary semiconductor structure along the horizontal plane C-C' in FIG. 10B.

FIG. 10D is a vertical cross-sectional view of the exemplary semiconductor structure along the vertical plane D-D' in FIG. 10A.

FIG. 10E is a vertical cross-sectional view of the exemplary semiconductor structure along the vertical plane E-E' in FIG. 10A.

DETAILED DESCRIPTION

Figure 1C:
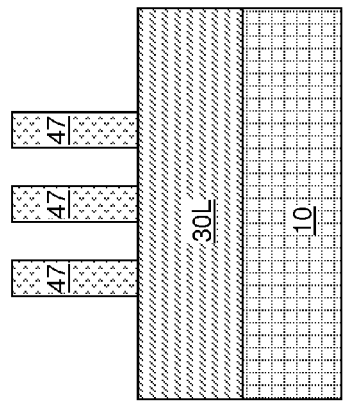
FIG. 1C is a vertical cross-sectional view of the exemplary semiconductor structure along the vertical plane C-C' in FIG. 1A.

As stated above, the present disclosure relates to a compound fin field effect transistor (finFET) including self-aligned epitaxial source/drain extension regions and a method of manufacturing the same. Aspects of the present disclosure are now described in detail with accompanying figures. It is noted that like reference numerals refer to like elements across different embodiments. The drawings are not necessarily drawn to scale.

Figure 1A:
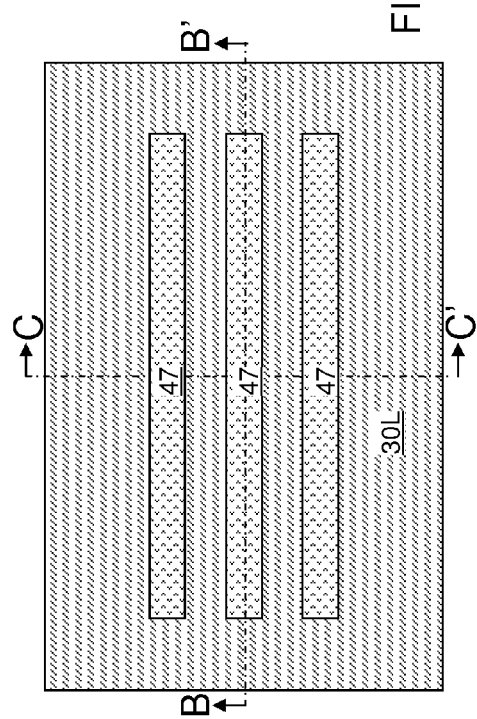
FIG. 1A is a top-down view of an exemplary semiconductor structure after application and patterning of a photoresist layer over a vertical stack of an insulator substrate and a single crystalline compound semiconductor material layer in epitaxial alignment with a single crystalline compound insulator material of the insulator substrate according to an embodiment of the present disclosure.
Figure 1B:
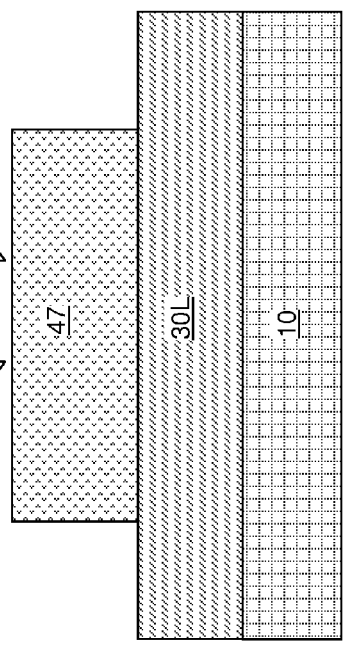
FIG. 1B is a vertical cross-sectional view of the exemplary semiconductor structure along the vertical plane B-B' in FIG. 1A.

FIGS. 1A-1C, an exemplary semiconductor structure according to an embodiment of the present disclosure includes an insulator substrate 10 and a single crystalline compound semiconductor material layer 30L. The insulator substrate 10 can be a single crystalline compound insulator material. As used herein, an insulator material refers to a material having a resistivity greater than $1.0 \times 10^3$ Ohm-cm. As used herein, a compound insulator material refers to an insulator material that includes a compound of at least two elements. The compound insulator material can be a III-V compound including a Group III element and a Group V element, or can be a II-V compound including a Group II element and a Group VI element. As used herein, a single crystalline compound insulator material refers to a compound insulator material that is single crystalline, i.e., having an epitaxial alignment among atoms throughout the entirety of the compound insulator material. In one embodiment, the single crystalline compound insulator material of the insulator substrate 10 can be gallium arsenide.

The single crystalline compound semiconductor material layer 30L includes a single crystalline compound semiconductor material in epitaxial alignment with the single crystalline compound insulator material of the insulator substrate 10. As used herein, a semiconductor material refers to a material having a resistivity less than $1.0 \times 10^3$ Ohm-cm and greater than $1.0 \times 10^{-3}$ Ohm-cm. As used herein, a compound semiconductor material refers to a semiconductor material that includes a compound of at least two elements. The thickness of the single crystalline compound semiconductor material layer 30L can be in a range from 12 nm to 80 nm, although lesser and greater thicknesses can also be employed.

The single crystalline compound semiconductor material of the single crystalline compound semiconductor material layer 30L can be in epitaxial alignment with the single crystalline compound insulator material of the insulator substrate 10. In one embodiment, the single crystalline compound semiconductor material layer 30L can be formed by epitaxial deposition of the single crystalline compound semiconductor material upon the insulator substrate 10. In one embodiment, metal organic chemical vapor deposition (MOCVD) can be employed to deposit the single crystalline compound semiconductor material layer 30L with epitaxial alignment to the insulator substrate 10. In one embodiment, the single crystalline compound semiconductor material can be InGaAs.

A photoresist layer 47 can be applied over a vertical stack of the insulator substrate 10 and the single crystalline compound semiconductor material layer 30L. The photoresist layer 48 is patterned by lithographic exposure and development to cover portions of the single crystalline compound semiconductor material layer 30L. The pattern in the photoresist layer 48 can be selected such that the horizontal cross-sectional shapes of the patterned photoresist layer 48 include parallelograms. In one embodiment, the horizontal cross-sectional shapes of the patterned photoresist layer 48 include rectangular shapes each having a pair of lengthwise edges. As used herein, a lengthwise edge of a rectangle is an edge that is not a shortest edge. In one embodiment, the horizontal cross-sectional shapes of the patterned photoresist layer 48 include a plurality of rectangular shapes having lengthwise edges that extend along a same horizontal direction, which is herein referred to as a lengthwise direction L.

Referring to FIGS. 2A-2C, the pattern in the photoresist layer 47 can be transferred into the single crystalline compound semiconductor material layer 30L by an anisotropic etch to pattern the single crystalline compound semiconductor material layer 30L. A plurality of semiconductor fins 30 is formed on the top surface of the insulator substrate 10 by remaining portions of the single crystalline compound semiconductor material layer 30L. The photoresist layer 47 is subsequently removed, for example, by ashing.

Each of the plurality of semiconductor fins 30 can include the single crystalline compound semiconductor material, and can be epitaxially aligned to the single crystalline compound insulator material of the insulator substrate 10. Each of the plurality of semiconductor fins 30 can have a pair of vertical sidewalls laterally extending along the lengthwise direction L. In one embodiment, each of the plurality of semiconductor fins 30 can have a first width w1 throughout the entirety thereof. Thus, a pair of sidewalls of each semiconductor fin 30 can extend along the lengthwise direction L with a separation distance of the first width w1. In one embodiment, each of the plurality of semiconductor fins 30 can be laterally spaced from a neighboring semiconductor fin 30 by a spacing s.

Referring to FIGS. 3A-3C, an amorphous dielectric material layer 12 can be deposited on physically exposed surfaces of the insulator substrate 10 and physically exposed surfaces of the plurality of semiconductor fins 30. The amorphous dielectric material layer 12 can include, for example, silicon oxide, silicon nitride, silicon oxynitride, a dielectric metal oxide, a dielectric metal nitride, a dielectric metal oxynitride, or a combination thereof. The amorphous dielectric material layer 12 can be deposited conformally or non-conformally. The amorphous dielectric material layer 12 can be deposited, for example, by chemical vapor deposition, atomic layer deposition, spin coating, or other deposition methods known in the art. The thickness of the amorphous dielectric material layer 12, as measured on a horizontal surface of the insulator substrate 10, can be in a range from 1 nm to 12 nm, although lesser and greater thicknesses can also be employed.

The amorphous dielectric material layer 12 can be subsequently patterned such that the amorphous dielectric material layer 12 is removed from a contiguous area in which the plurality of semiconductor fins 30 is present. In one embodiment, a photoresist layer 17 can be applied over the amorphous dielectric material layer 12, and can be subsequently patterned to form an opening laterally surrounding the plurality of semiconductor fins 30. The pattern of the opening in the photoresist layer 17 can be selected such that the sidewalls of the patterned photoresist layer 17 around the opening is laterally offset by a finite distance from all sidewalls of the plurality of semiconductor fins despite overlay variations during patterning of the photoresist layer 17.

The amorphous dielectric material layer 12 can be subsequently patterned by an etch process employing the photoresist layer 17 as an etch mask. The etch process is selective to the semiconductor material of the plurality of semiconductor fins 30 to prevent collateral etching of the plurality of semiconductor fins 30. The etch process can be an isotropic etch process or an anisotropic etch process. Top surfaces of the insulator substrate 10 are physically exposed within the area of the opening in the photoresist layer 17, which coincides with the area of the opening in the amorphous dielectric material layer 12. The remaining portions of the amorphous dielectric material layer 12 do not contact the plurality of semiconductor fins and laterally surround the plurality of semiconductor fins. The remaining portions of the amorphous dielectric material layer 12 are laterally spaced from the plurality of semiconductor fins 30. The photoresist layer 17 is removed after patterning the amorphous dielectric material layer 12.

Figure 4A:
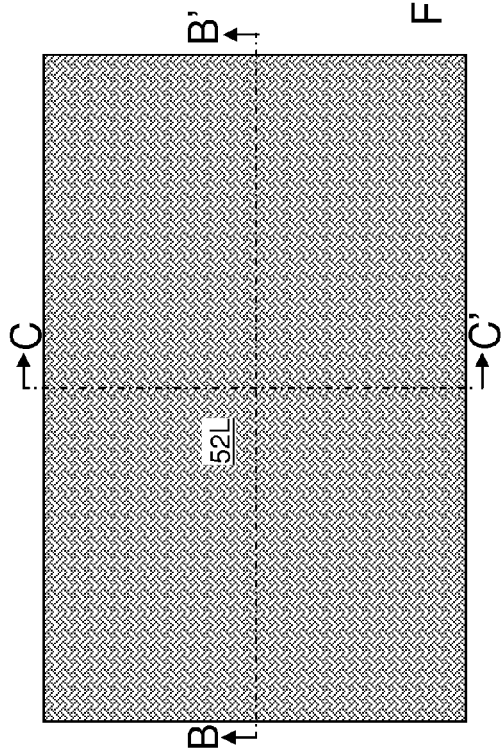
FIG. 4A is a top-down view of the exemplary semiconductor structure after formation of a gate dielectric layer and a gate electrode layer according to an embodiment of the present disclosure.
Figure 4C:
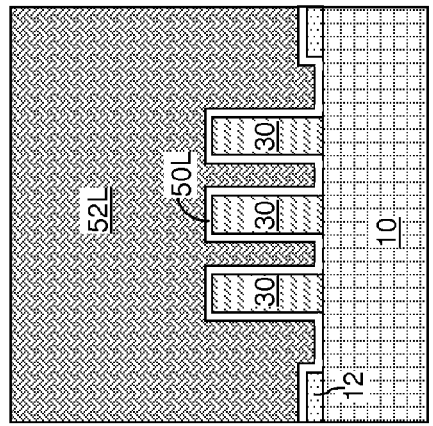
FIG. 4C is a vertical cross-sectional view of the exemplary semiconductor structure along the vertical plane C-C' in FIG. 4A.
Figure 4B:
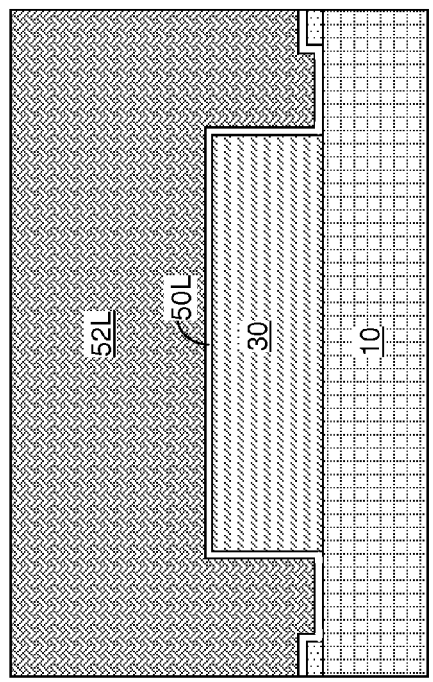
FIG. 4B is a vertical cross-sectional view of the exemplary semiconductor structure along the vertical plane B-B' in FIG. 4A.

Referring to FIGS. 4A-4C, a gate dielectric layer 50L and a gate electrode layer 52L can be sequentially deposited. The gate dielectric layer 50L can include a dielectric semiconductor oxide such as silicon oxide, a dielectric semiconductor nitride such as silicon nitride, a dielectric semiconductor oxynitride such as silicon oxynitride, a dielectric metal oxide such as $HfO_2$, $ZrO_2$, $La_2O_3$, and $Al_2O_3$, a dielectric metal nitride, a dielectric metal oxynitride, a dielectric metal silicate, or combinations thereof. The gate dielectric layer 50L can be formed by atomic layer deposition (ALD), chemical vapor deposition (CVD), or other methods for depositing at least one dielectric material as known in the art. The thickness of the gate dielectric layer 50L can be in a range from 1 nm to 6 nm, although lesser and greater thicknesses can also be employed.

The gate electrode layer 52L includes a conductive material, which can be a metallic material, a doped semiconductor material, or a combination thereof. As used herein, a conductive material refers to a material having a resistivity less than $1.0 \times 10^{-3}$ Ohm-cm. The gate electrode layer 52L can be formed by chemical vapor deposition, physical vapor deposition, atomic layer deposition, vacuum evaporation, or other methods for depositing a conductive material as known in the art. Optionally, the top surface of the gate electrode layer 52L may be planarized, for example, by chemical mechanical planarization (CMP). The thickness of the gate electrode layer 52L, as measured over a topmost horizontal surface of the gate dielectric layer 50L, can be in a range from 25 nm to 200 nm, although lesser and greater thicknesses can also be employed.

Figure 5A:
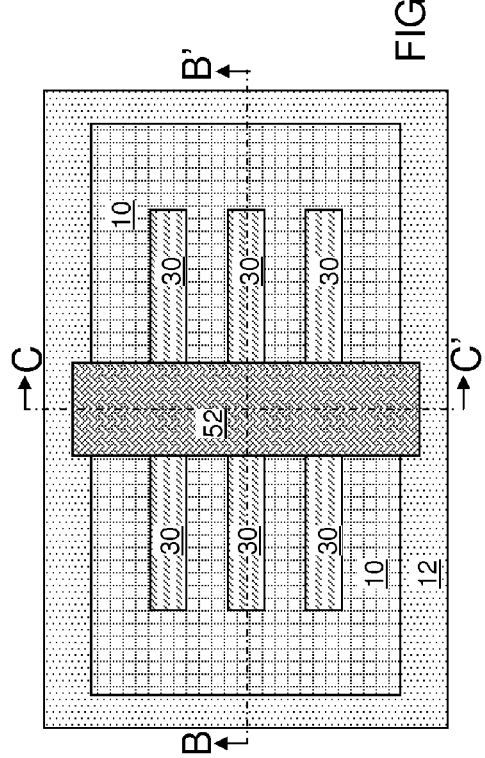
FIG. 5A is a top-down view of the exemplary semiconductor structure after formation of a gate stack including a gate dielectric and a gate electrode by patterning the gate electrode layer and the gate dielectric layer according to an embodiment of the present disclosure.
Figure 5C:
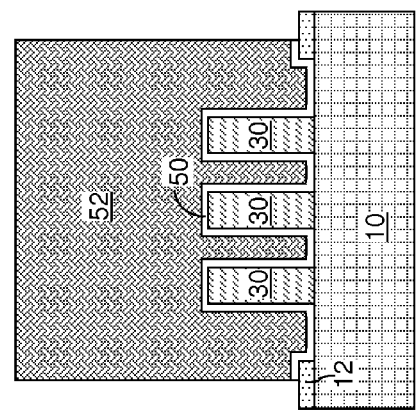
FIG. 5C is a vertical cross-sectional view of the exemplary semiconductor structure along the vertical plane C-C' in FIG. 5A.
Figure 5B:
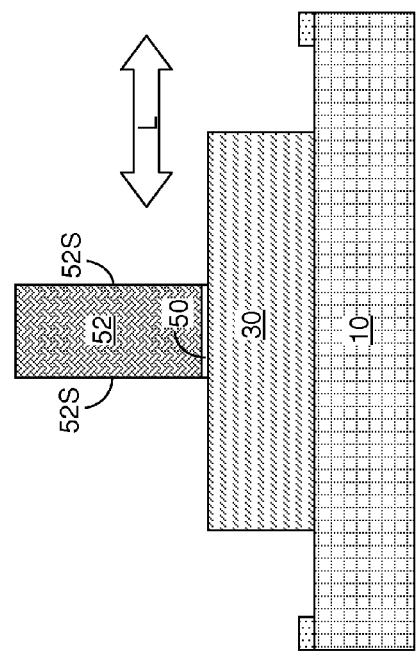
FIG. 5B is a vertical cross-sectional view of the exemplary semiconductor structure along the vertical plane B-B' in FIG. 5A.
Figures 6A, 6B:
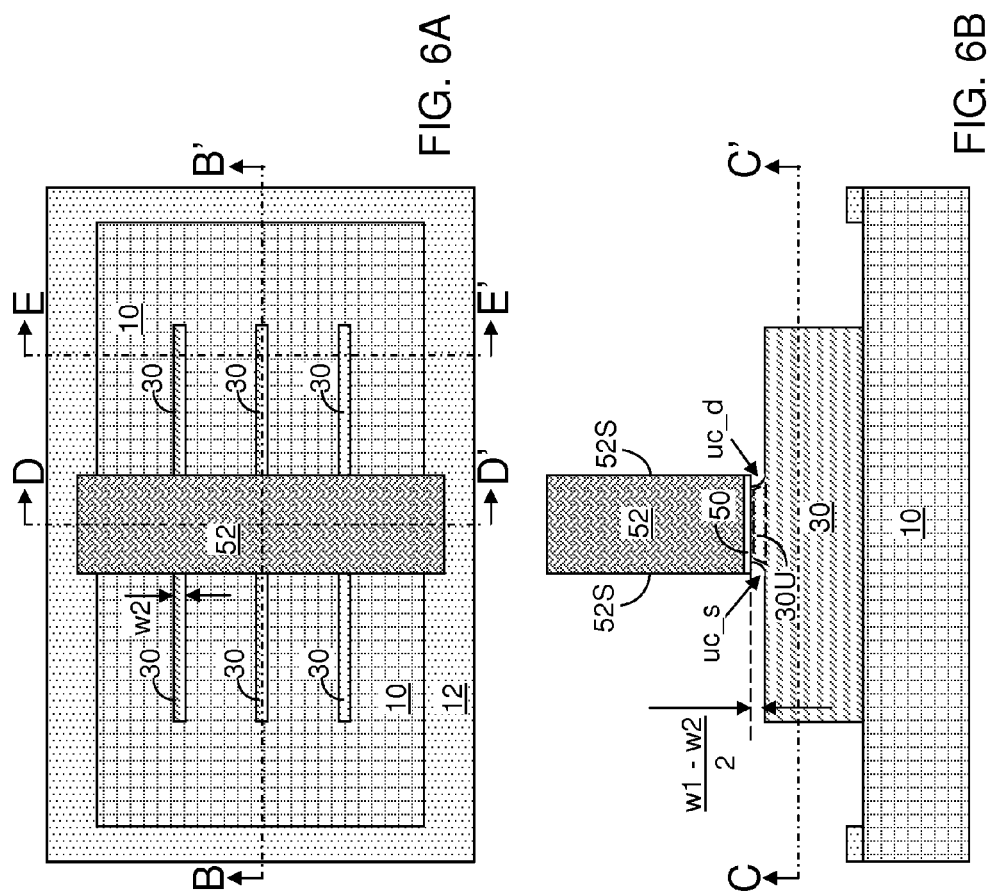
FIG. 6A is a top-down view of the exemplary semiconductor structure after recessing physically exposed surfaces of the semiconductor fins employing the gate stack as an etch mask according to an embodiment of the present disclosure.
FIG. 6B is a vertical cross-sectional view of the exemplary semiconductor structure along the vertical plane B-B' in FIG. 6A.
Figure 6C:
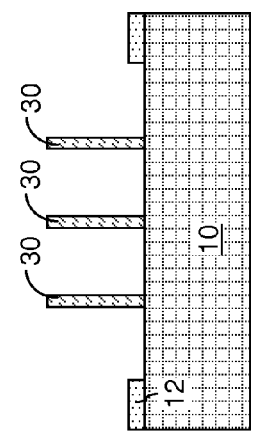
FIG. 6C is a horizontal cross-sectional view of the exemplary semiconductor structure along the horizontal plane C-C' in FIG. 6B.
Figure 6D:
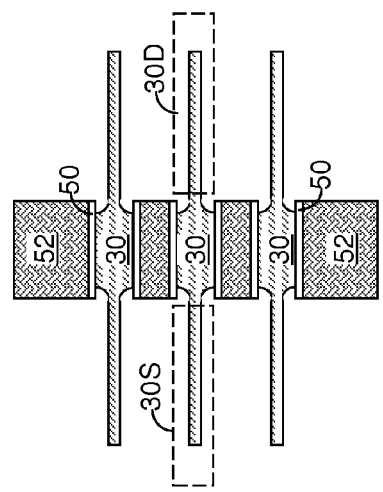
FIG. 6D is a vertical cross-sectional view of the exemplary semiconductor structure along the vertical plane D-D' in FIG. 6A.
Figure 6E:
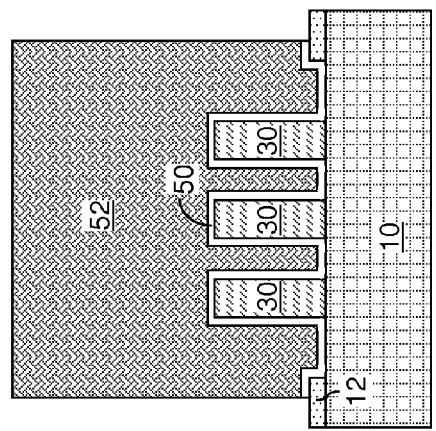
FIG. 6E is a vertical cross-sectional view of the exemplary semiconductor structure along the vertical plane E-E' in FIG. 6A.
Figure 7A:
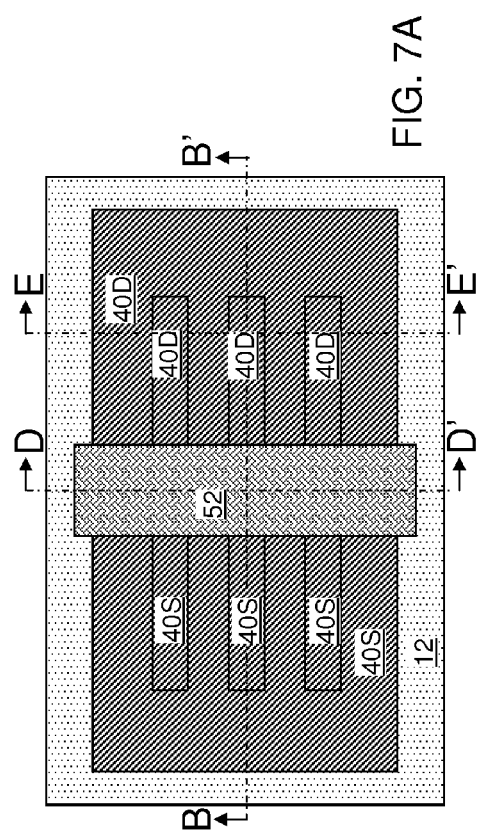
FIG. 7A is a top-down view of the exemplary semiconductor structure after formation of a source-extension region and a drain-extension region by a first selective epitaxy process according to an embodiment of the present disclosure.
Figure 7B:
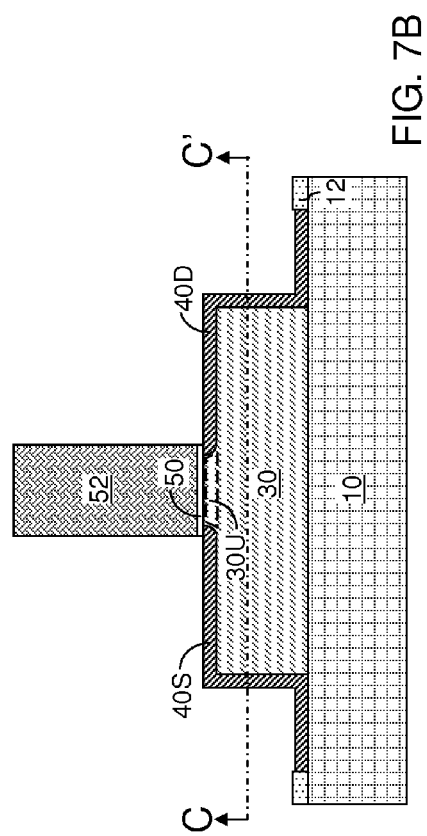
FIG. 7B is a vertical cross-sectional view of the exemplary semiconductor structure along the vertical plane B-B' in FIG. 7A.
Figure 7C:
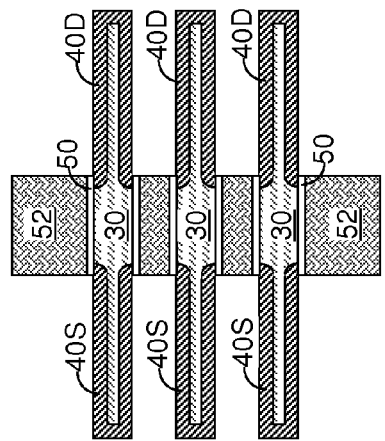
FIG. 7C is a horizontal cross-sectional view of the exemplary semiconductor structure along the horizontal plane C-C' in FIG. 7B.
Figure 7E:
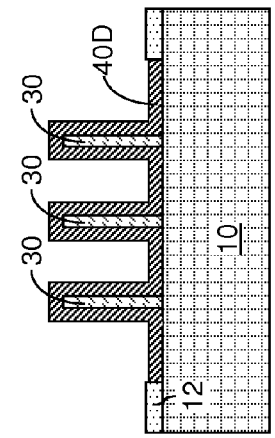
FIG. 7E is a vertical cross-sectional view of the exemplary semiconductor structure along the vertical plane E-E' in FIG. 7A.
Figure 7D:
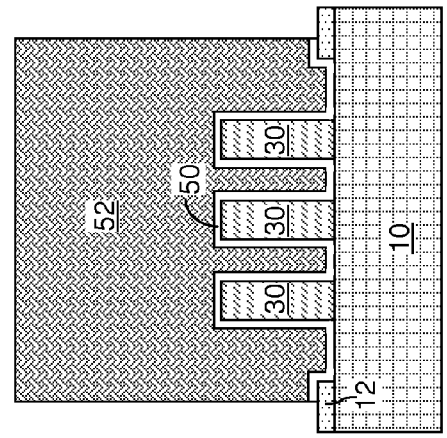
FIG. 7D is a vertical cross-sectional view of the exemplary semiconductor structure along the vertical plane D-D' in FIG. 7A.

Referring to FIGS. 5A-5C, a stack of a gate dielectric 50 and a gate electrode 52 can be formed by patterning the gate electrode layer 52L and the gate dielectric layer 50L. For example, a photoresist layer (not shown) can be applied over the gate electrode layer 52L, and can be lithographically patterned to define a horizontal cross-sectional shape of the gate electrode 52. The pattern in the photoresist layer can be subsequently transferred into the gate electrode layer 52L and the gate dielectric layer 50L by at least one etch. In one embodiment, the pattern in the photoresist layer can be transferred into the gate electrode layer 52L by an anisotropic etch that is selective to the material of the gate dielectric layer 50L. Subsequently, the pattern in the photoresist layer can be transferred into the gate dielectric layer 50L by an isotropic etch that is selective to the plurality of semiconductor fins 30. A remaining portion of the gate electrode layer 52L constitutes the gate electrode 52, and a remaining portion of the gate dielectric layer 50L constitutes the gate dielectric 50. The stack of the gate dielectric 50 and the gate electrode 52 straddles the plurality of semiconductor fins 30 such that two end portions of each semiconductor fins 30 do not underlie the stack (50, 52). The stack of the gate dielectric 50 and the gate electrode 52 can have a pair of parallel sidewalls 52S that are perpendicular to the lengthwise direction L. In this case, the pair of parallel sidewalls 52S is perpendicular to the sidewalls of the plurality of semiconductor fins 30 that extend along the lengthwise direction L.

Referring to FIGS. 6A-6E, physically exposed surfaces of the plurality of semiconductor fins 30 can be recessed employing the gate stack (50, 52) as an etch mask. The recessing of the physically exposed surfaces of the plurality of semiconductor fins 30 can be performed employing an isotropic etch. The isotropic etch can be a dry etch such as a chemical dry etch (CDE), or can be a wet etch. An etchant that etches the single crystalline semiconductor material of the plurality of semiconductor fins 30 can be employed. For example, if a wet etch solution including diluted phosphoric acid and optionally including hydrogen peroxide can be employed to etch the semiconductor material of the plurality of semiconductor fins 30.

The physically exposed portions of the semiconductor fins 30 can be thinned such that the width of physically exposed portions of each semiconductor fin 30 decrease from the first width t1 (See FIG. 2A) to a second width t2 that is less than the first width t1. The second width t2 can be in a range from 10% to 90% of the first width t1, although lesser and greater percentages can also be employed. The distance by which the sidewalls of the plurality of semiconductor fins 30 laterally shift is herein referred to as a recess distance, and is equal to one half of the difference between the first width w1 and the second width w2, i.e., (w1−w2)/2. Further, the top surface of each physically exposed portion of the plurality of semiconductor fins 30 is vertically recessed by the recess distance. A portion of the top surface of each semiconductor fin 30 in contact with a bottom surface of the gate dielectric 50 is not vertically recessed by the recess etch. The top surface of each semiconductor fin 30 in contact with a bottom surface of the gate dielectric 50 is the topmost surface of the semiconductor fin 30, and is vertically offset from the recessed top surfaces of the semiconductor fin 30 by the recess distance, i.e., (w1−w2)/2. The recess distance can be in a range from 3 nm to 15 nm, although lesser and greater recess distances can also be employed. In one embodiment, the recess distance can be in a range from 5 nm to 8 nm.

Within each semiconductor fin 30, a first fin portion having the second width w2 is formed on one side of the gate stack (50, 52) and a second fin portion having the second width w2 is formed on the other side of the gate stack (50, 52). The first fin portion is herein referred to as a source-side fin portion 30S, and the second fin portion is herein referred to as a drain-side fin portion 30D. The source-side fin portion 30S and the drain side fin portion have the second width w2.

Each semiconductor fin 30 contains a middle portion that includes the greatest rectangular parallelepiped that includes a top rectangular surface contacting the interface between the semiconductor fin 30 and the gate dielectric 50 while not extending out of the interface and additionally includes a bottom rectangular surface contacting the interface between the semiconductor fin 30 and the insulator substrate 10. The entirety of the middle portion includes a first pair of sidewalls laterally spaced by the first width w1. Each semiconductor fin 30 further contains a source-side fin portion 30S including a second pair of sidewalls separated by the second width w2. Further, each semiconductor fin 30 contains a drain-side fin portion 30D including a third pair of sidewalls separated by the second width w2. The drain-side fin portion 30D is laterally spaced from the source-side fin portion 30S by the middle portion. The gate stack (50, 52) straddles each of the middle portions.

For each semiconductor fin 30, undercut regions are formed underneath peripheral portions of the gate stack (52, 54) by the recessing of the physically exposed surfaces of the plurality of semiconductor fins 30. The undercut regions are formed directly underneath the pair of parallel sidewalls 52S of the gate stack (50, 52), and can include a source-side undercut region uc_s that is formed in proximity to the source-side fin portion 30S having the second width w2, and a drain-side undercut region uc_d that is formed in proximity to the drain-side fin portion 30D having the second width w2. The surfaces of the semiconductor fins 30 can be concave underneath each source-side undercut region uc_s and underneath each drain-side undercut region uc_d. In each semiconductor fin 30, the topmost surface of each middle portion is vertically offset from the top surface of the source-side fin portion 30S and from the top surface of the drain-side fin portion 30D by a vertical offset distance that is equal to the recess distance, i.e., one half of the difference between the first width w1 and the second width w2. An upper portion 30U of each semiconductor fin 30 is herein defined as the portion that is located above the horizontal plane including the top surface of the source-side fin portion 30S and the top surface of the drain-side fin portion 30D. Additional undercut regions are formed directly underneath vertical peripheral portions of the gate stack (50, 52) from which concave portions of sidewalls of the source-side fin portion 30S and concave portions of sidewalls of the drain-side fin portion 30D are laterally recessed.

Referring to FIGS. 7A-7E, a source-extension region 40S and a drain-extension region 40D can be simultaneously formed by a first selective epitaxy process. The first selective epitaxy process deposits a doped single crystalline compound semiconductor material on physically exposed single crystalline surfaces, which include the single crystalline dielectric surface of the insulator substrate 10 and the single crystalline semiconductor surfaces of the plurality of semiconductor fins 30. The doped single crystalline compound semiconductor material deposited by the first selective epitaxy is herein referred to as a first doped compound semiconductor material. The first doped compound semiconductor material can be a doped III-V compound semiconductor material or a doped II-VI compound semiconductor material. If the first doped compound semiconductor material is a doped III-V compound semiconductor material, the total number of Group III element atoms can be greater than the total number of Group V element atoms (and thus, having a p-type doping), or the total number of Group III element atoms can be less than the total number of Group V element atoms (and thus, having a p-type doping). If the first doped compound semiconductor material is a doped II-VI compound semiconductor material, the total number of Group II element atoms can be greater than the total number of Group VI element atoms (and thus, having a p-type doping), or the total number of Group II element atoms can be less than the total number of Group VI element atoms (and thus, having a p-type doping).

The first doped compound semiconductor material can be selected so that the degree of lattice mismatch between the deposited doped single crystalline compound semiconductor material and the single crystalline compound semiconductor material of the plurality of semiconductor fins 30 allows epitaxial alignment therebetween. In this case, each of the source-extension region 40S and the drain-extension region 40D can be formed in epitaxial alignment with the single crystalline compound semiconductor material in the plurality of semiconductor fins 30. Further, the lattice mismatch between the deposited doped single crystalline compound semiconductor material and the single crystalline insulator material of the insulator substrate 10 can be small enough (e.g., less than about 5%) to allow epitaxial alignment therebetween. In this case, each of the source-extension region 40S and the drain-extension region 40D can be formed in epitaxially aligned with the insulator substrate 10. The undercut regions (uc_s, uc_d) can be filled with the source-extension region 40S and the drain-extension region 40D. The source-extension region 40S can be formed as an integral structure, i.e., a single contiguous structure. The drain-extension region 40D can be formed as an integral structure.

The first doped compound semiconductor material of the source-extension region 40S and the drain-extension region 40D can be formed, for example, by a metal organic chemical vapor deposition (MOCVD) process. During the MOCVD process, precursor gases for reactants and an etchant are simultaneously or alternately flowed into a process chamber in which the exemplary semiconductor structure is placed. The precursor gases for reactants include at least one first precursor gas for at least one Group III element or at least one Group II element, and further include at least one second precursor gas for at least one Group V element or at least one Group VI element. The flow rates for the at least one first precursor gas and the at least one second precursor gas are selected such that there is an imbalance between deposited Group III elements and deposited Group V elements, or an imbalance between deposited Group II elements and deposited Group VI elements.

If the plurality of semiconductor fins 30 is doped with p-type doping or n-type doping, the conductivity type of the first doped compound semiconductor material can be the opposite of the conductivity type of the plurality of semiconductor fins 30. For example, the plurality of semiconductor fins 30 can have a p-type doping and the source-extension region 40S and the drain-extension region 40D can have an n-type doping, or vice versa. In this case, the conductivity type of the plurality of semiconductor fins 30 is herein referred to as a first conductivity type, and the conductivity type of the source-extension region 40S and the drain-extension region 40D is herein referred to as a second conductivity type, which is the opposite of the first conductivity type. Alternately, the plurality of semiconductor fins 30 can be intrinsic, and the source-extension region 40S and the drain-extension region 40D can be p-doped or n-doped.

The etchant gas etches deposited doped compound semiconductor material during the first selective epitaxy process. During the first selective epitaxy process, single crystalline compound semiconductor materials are deposited on single crystalline surfaces at a faster deposition rate than the rate at which amorphous compound semiconductor materials are deposited on amorphous surfaces. The amorphous surfaces include the physically exposed surfaces of the amorphous dielectric material layer 12, the gate dielectric 50, and the gate electrode 52. The etch rate of the etchant gas is substantially independent of the crystallinity of the deposited compound semiconductor material. The flow rate of the etchant gas is set such that the etch rate of the amorphous compound semiconductor materials is greater than the deposition rate of the amorphous compound semiconductor materials and less than the deposition rate of the single crystalline compound semiconductor materials. In this case, there is no net deposition of the first doped compound semiconductor material on the amorphous surfaces of the amorphous dielectric material layer 12, the gate dielectric 50, and the gate electrode 52, while the source-extension region 40S and the drain-extension region 40D are formed on the physically exposed surfaces of the plurality of semiconductor fins 30.

The thickness of the source-extension region 40S and the drain-extension region 40D is the thickness of the deposited first doped compound semiconductor material as measured on a sidewall of a source-side fin portion or on a sidewall of a drain-side fin portion. The thickness of the source-extension region 40S and the drain-extension region 40D can be in a range from 3 nm to 15 nm, although lesser and greater recess distances can also be employed. In one embodiment, the thickness of the source-extension region 40S and the drain-extension region 40D can be in a range from 5 nm to 8 nm. The thickness of the source-extension region 40S and the drain-extension region 40D can be greater than, equal to, or lesser than, the recess distance. In one embodiment, the first doped compound semiconductor material of the source-extension region 40S and the drain-extension region 40D can be a p-doped InGaAs or an n-doped InGaAs.

The source-extension region 40S is in contact with the second pair of sidewalls of each source-side fin portion and a top surface of each source-side fin portion. The drain-extension region 40D is in contact with the third pair of sidewalls of each drain-side fin portion and a top surface of the drain-side fin portion 40S. If the insulator substrate 10 includes a single crystalline compound insulator material, each of the source-extension region 40S and the drain-extension region 40D can include a portion that contacts, and is epitaxially aligned to, the insulator substrate 10.

Figure 8A:
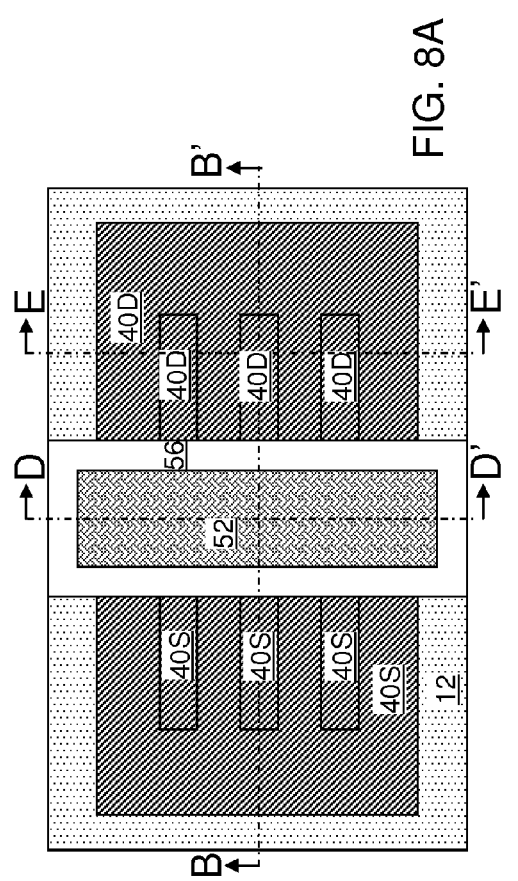
FIG. 8A is a top-down view of the exemplary semiconductor structure after formation of a gate spacer according to an embodiment of the present disclosure.
Figure 8B:
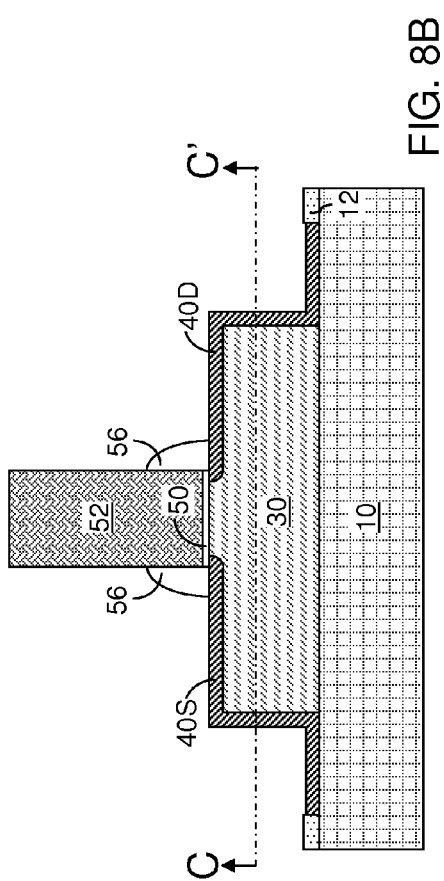
FIG. 8B is a vertical cross-sectional view of the exemplary semiconductor structure along the vertical plane B-B' in FIG. 8A.
Figure 8C:
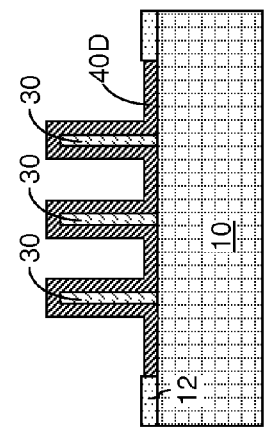
FIG. 8C is a horizontal cross-sectional view of the exemplary semiconductor structure along the horizontal plane C-C' in FIG. 8B.
Figure 8D:
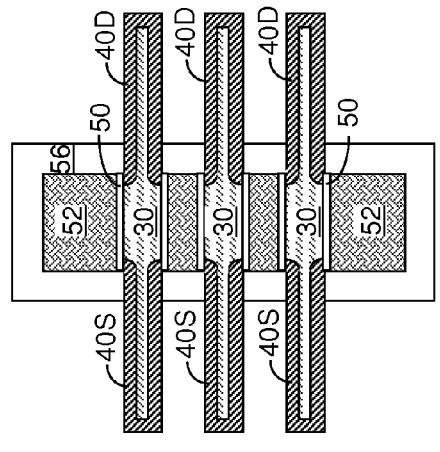
FIG. 8D is a vertical cross-sectional view of the exemplary semiconductor structure along the vertical plane D-D' in FIG. 8A.
Figure 8E:
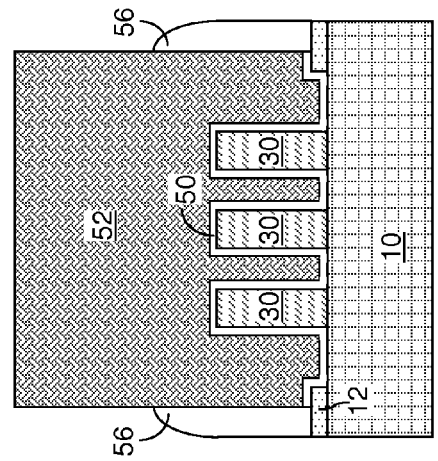
FIG. 8E is a vertical cross-sectional view of the exemplary semiconductor structure along the vertical plane E-E' in FIG. 8A.
Figure 9E:
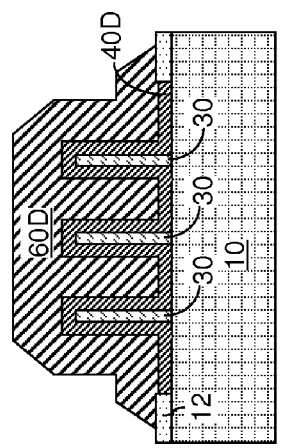
FIG. 9E is a vertical cross-sectional view of the exemplary semiconductor structure along the vertical plane E-E' in FIG. 9A.
Figure 9C:
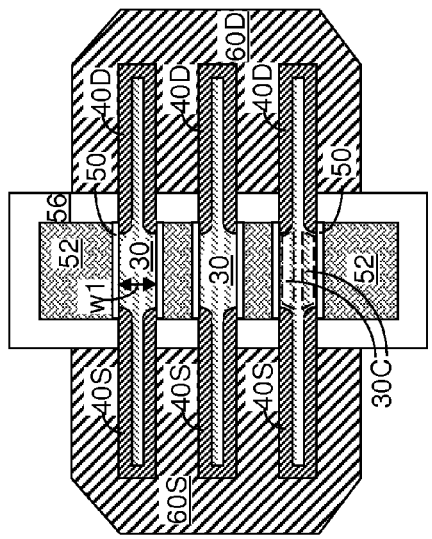
FIG. 9C is a horizontal cross-sectional view of the exemplary semiconductor structure along the horizontal plane C-C' in FIG. 9B.
Figure 9D:
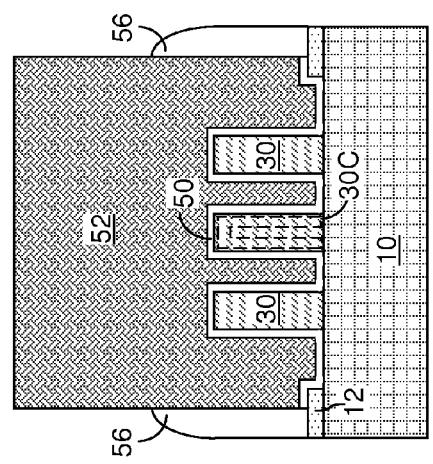
FIG. 9D is a vertical cross-sectional view of the exemplary semiconductor structure along the vertical plane D-D' in FIG. 9A.

Referring to FIGS. 8A-8C, a gate spacer 56 can be formed around the gate stack (50, 52). The gate spacer 56 can be formed, for example, by a conformal deposition of a dielectric material layer, and a subsequent anisotropic etch that removes horizontal portions of the dielectric material layer. The dielectric material layer includes a dielectric material such as silicon nitride, silicon oxide, silicon oxynitride, or a combination thereof. In one embodiment, the dielectric material layer includes a material that is different from the dielectric material of the amorphous dielectric material layer 12. Conformal deposition of the dielectric material layer can be performed, for example, by chemical vapor deposition (CVD). The thickness of the dielectric material layer can be in a range from 10 nm to 100 nm, although lesser and greater thicknesses can also be employed.

The anisotropic etch can be performed employing an etch chemistry that is selective to the first compound semiconductor material of the source-extension region 40S and the drain-extension region 40D. Further, the etch chemistry of the anisotropic etch can be selective to the dielectric material of the amorphous dielectric material layer 12. After removal of horizontal portions of the dielectric material layer during an initial portion of the anisotropic etch, vertical portions of the dielectric material layer are vertically recessed during a subsequent portion of the anisotropic etch so that lengthwise sidewalls of the source-extension region 40S and the drain-extension region 40D are physically exposed in areas not covered by the gate electrode 52 and laterally spaced from the gate electrode 52 by a distance greater than the thickness of the dielectric material layer as deposited. The remaining portion of the dielectric material layer constitutes the gate spacer 56. The gate spacer 56 can be formed as an integral structure that laterally surrounds the gate stack (50, 52). In one embodiment, the gate spacer 56 can include a single hole therein, and thus, topologically homeomorphic to a torus.

Referring to FIGS. 9A-9E, a raised source region 60S and a raised drain region 60D can be simultaneously formed by a second selective epitaxy process. The second selective epitaxy process can deposit another doped single crystalline compound semiconductor material, which is herein referred to as a second doped compound semiconductor material. The second doped compound semiconductor material may be the same as (i.e., have the same composition as), or different from (i.e., have a different composition from), the first doped compound semiconductor material. The second doped compound semiconductor material is deposited on physically exposed single crystalline surfaces, which include the single crystalline semiconductor surfaces of the source-extension region 40S and the drain-extension region 40D. The second doped compound semiconductor material can be a doped III-V compound semiconductor material or a doped II-VI compound semiconductor material. If the second doped compound semiconductor material is a doped III-V compound semiconductor material, the total number of Group III element atoms can be greater than the total number of Group V element atoms (and thus, having a p-type doping), or the total number of Group III element atoms can be less than the total number of Group V element atoms (and thus, having a p-type doping). If the second doped compound semiconductor material is a doped II-VI compound semiconductor material, the total number of Group II element atoms can be greater than the total number of Group VI element atoms (and thus, having a p-type doping), or the total number of Group II element atoms can be less than the total number of Group VI element atoms (and thus, having a p-type doping).

The second doped compound semiconductor material of the raised source region 60S and the raised drain region 60D can be formed, for example, by a metal organic chemical vapor deposition (MOCVD) process. During the MOCVD process, precursor gases for reactants and an etchant are simultaneously or alternately flowed into a process chamber in which the exemplary semiconductor structure is placed. The precursor gases for reactants include at least one first precursor gas for at least one Group III element or at least one Group II element, and further include at least one second precursor gas for at least one Group V element or at least one Group VI element. The flow rates for the at least one first precursor gas and the at least one second precursor gas are selected such that there is an imbalance between deposited Group III elements and deposited Group V elements, or an imbalance between deposited Group II elements and deposited Group VI elements. The conductivity type of the raised source region 60S and the raised drain region 60D is the same as the conductivity type of the source-extension region 40S and the drain-extension region 40D.

The etchant gas etches deposited doped compound semiconductor material during the second selective epitaxy process. During the second selective epitaxy process, single crystalline compound semiconductor materials are deposited on single crystalline surfaces at a faster deposition rate than the rate at which amorphous compound semiconductor materials are deposited on amorphous surfaces. The amorphous surfaces include the physically exposed surfaces of the amorphous dielectric material layer 12, the gate dielectric 50, and the gate electrode 52. The etch rate of the etchant gas is substantially independent of the crystallinity of the deposited compound semiconductor material. The flow rate of the etchant gas is set such that the etch rate of the amorphous compound semiconductor materials is greater than the deposition rate of the amorphous compound semiconductor materials and less than the deposition rate of the single crystalline compound semiconductor materials. In this case, there is no net deposition of the second doped compound semiconductor material on the amorphous surfaces of the amorphous dielectric material layer 12, the gate dielectric 50, and the gate electrode 52, while the raised source region 60S and the raised drain region 60D are formed on the physically exposed surfaces of the source-extension region 40S and the drain-extension region 40D.

Various portions of the raised source region 60 grow from various sidewall surface of the source-extension region 40S. When the thickness of the deposited second doped compound semiconductor material exceeds one half of a lateral separation distance between lengthwise sidewalls of the raised source region between a neighboring pair of semiconductor fins 30, portions of the deposited second doped compound semiconductor material can merge so that the raised source region 60S develops a contiguous topmost surface. Likewise, portions of the deposited second doped compound semiconductor material can merge so that the raised drain region 60D develops a contiguous topmost surface.

The thickness of the raised source region 60S and the raised drain region 60D can be defined as the thickness of the deposited second doped compound semiconductor material on a topmost surface of the source-extension region 40S and on a topmost surface of the drain-extension region 40D, respectively. The thickness of the raised source region 60S and the raised drain region 60D can be the same, and can be in a range from 10 nm to 60 nm, although lesser and greater recess distances can also be employed. In one embodiment, the doped single crystalline compound semiconductor material of the raised source region 60S and the raised drain region 60D can be a p-doped InGaAs or an n-doped InGaAs. If the insulator substrate 10 includes a single crystalline compound insulator material, each of the raised source region 60S and the raised drain region 60D can include a portion that contacts, and is epitaxially aligned to, the insulator substrate 10.

The exemplary semiconductor structure includes at least one semiconductor fin 30 located on a top surface of an insulator substrate 10. Each of the at least one semiconductor fin 30 includes a single crystalline compound semiconductor material, and laterally extends along a lengthwise direction L. The exemplary semiconductor structure includes a field effect transistor in which each of the at least one semiconductor fin 30 functions as a body, the combination of a source-extension region 40S and the raised source region 60S functions as a source, and the combination of a drain-extension region 40D and the raised drain region 60D functions as a drain. Each of the at least one semiconductor fin 30 includes a channel region 30C, which is a region underlying the gate dielectric 50 and an inversion layer is formed during operation of the field effect transistor. Each channel region 30C has a first pair of sidewalls separated by a first width w1 (See FIG. 2A). Each of the at least one semiconductor fin 30 contains a source-side fin portion 30S including a second pair of sidewalls separated by a second width w2 (See FIG. 6A) that is less than the first width w1. Further, each of the at least one semiconductor fin 30 contains a drain-side fin portion 30D including a third pair of sidewalls separated by the second width w2 and laterally spaced from the source-side fin portion 30S by a channel region 30C. The gate stack including the gate dielectric 50 and the gate electrode 52 straddles each channel region 30C.

The source-extension region 40S is in contact with a second pair of sidewalls and a top surface of each source-side fin portion 30S, and includes the first doped compound semiconductor material. The drain-extension region 40D is in contact with a third pair of sidewalls and a top surface of each drain-side fin portion 30D, and includes the first doped compound semiconductor material. The raised source region 60S is in contact with the source-extension region 40S, and including the second doped compound semiconductor material. The raised drain region 60D is in contact with the drain-extension region 40D, and includes the second doped compound semiconductor material.

All surfaces of the raised source region 60S are spaced from the at least one semiconductor fin 30 by at least the thickness of the source-extension region 40S. All surfaces of the raised drain region 60D are spaced from the at least one semiconductor fin 30 by at least the thickness of the drain-extension region 40D. Each channel region 30C can have an inverted U-shaped vertical cross-sectional shape within a plane that is perpendicular to the lengthwise direction L.

The source-side fin portion 30S and the drain-side fin portion 30D have a conductivity type that is the opposite of the conductivity type of the source-extension region 40S, the drain-extension region 40D, the raised source region 60S, and the raised drain region 60D. A first p-n junction is present between the source-extension region 40S and the source-side fin portion 30S. A second p-n junction is present between the drain-extension region 40D and the drain-side fin portion 30D. Each of the first and second p-n junctions includes a pair of vertical surfaces laterally extending along the lengthwise direction L.

The exemplary semiconductor structure of FIGS. 9A-9E may be operated after formation of various contact structures (such as contact vias) thereupon. Optionally, an anneal may be performed to outdiffuse the dopants in the source-extension region 40S, the drain-extension region 40D, the raised source region 60S, and the raised drain region 60D into the source-side fin portion 30S and the drain-side fin portion 30D, and to provide a variation of the exemplary semiconductor structure. In this case, the source-side fin portion 30S and the drain-side fin portion 30D can have a doping of the same conductivity type as the doping of the source-extension region 40S, the drain-extension region 40D, the raised source region 60S, and the raised drain region 60D. The portion of each semiconductor fin 30B that remains intrinsic or maintains a doping of the opposite conductivity type of the doping of the source-extension region 40S, the drain-extension region 40D, the raised source region 60S, and the raised drain region 60D is herein referred to as a body region 30B, which functions as the body of the field effect transistor.

The source-side fin portion 30S and the drain-side fin portion 30D have a same conductivity type as the source-extension region 40S, the drain-extension region 40D, the raised source region 60S, and the raised drain region 60D. Each channel region 30C can have an inverted U-shaped vertical cross-sectional shape within a plane that is perpendicular to the lengthwise direction L.

The field effect transistors of various embodiments of the present disclosure are compound fin field effect transistors (finFET) in which the source-extension region 40S and the drain extension region 40D are self-aligned to the gate stack (50, 52). The self-aligned epitaxial source/drain extension regions can provide low extension resistance and high on-current compared to compound semiconductor devices known in the art.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A method of forming a semiconductor structure comprising:
    forming a semiconductor fin comprising a single crystalline compound semiconductor material and having a first width throughout on a top surface of an insulator substrate;
    forming a gate stack including a gate dielectric and a gate electrode over said semiconductor fin;
    recessing physically exposed surfaces of said semiconductor fin employing said gate stack as an etch mask, wherein a source-side fin portion and a drain-side fin portion that have a second width are formed; and
    simultaneously forming a source-extension region on said source-side fin portion and a drain-extension region on said drain-side fin portion by selective epitaxy of a doped compound semiconductor material.

2. The method of claim 1, further comprising simultaneously forming a raised source region on said source-extension region and a raised drain region on said drain-extension region by depositing another doped compound semiconductor material by another selective epitaxy.

3. The method of claim 2, further comprising forming a gate spacer around said gate stack after forming said source-extension region and said drain-extension region and prior to forming said raised source region and said raised drain region.

4. The method of claim 1, wherein said recessing of said physically exposed surfaces of said semiconductor fin employing said gate stack is performed employing an isotropic etch.

5. The method of claim 1, wherein said insulator substrate includes a single crystalline compound insulator material, and each of said source-extension region and said drain-extension region is formed in epitaxially aligned with said insulator substrate.

6. The method of claim 1, wherein said insulator substrate includes a single crystalline compound insulator material, and said semiconductor fin is formed by:
    forming a single crystalline compound semiconductor material layer by depositing said single crystalline compound semiconductor material in epitaxial alignment with said single crystalline compound insulator material; and
    patterning said single crystalline compound semiconductor material layer, wherein a remaining portion of said single crystalline compound semiconductor material layer is said semiconductor fin.

7. The method of claim 1, further comprising:
    depositing an amorphous dielectric material layer on said semiconductor fin and on a top surface of said insulator substrate prior to forming said gate stack; and
    patterning said amorphous dielectric material layer, wherein remaining portions of said amorphous dielectric material layer do not contact said semiconductor fin and laterally surround said semiconductor fin.

8. The method of claim 1, wherein undercut regions are formed underneath peripheral portions of said gate stack by said recessing of said physically exposed surfaces of said semiconductor fin, and said undercut regions are filled with said source-extension region and said drain-extension region.

* * * * *